US006943289B2

(12) United States Patent
Staudinger et al.

(10) Patent No.: US 6,943,289 B2
(45) Date of Patent: Sep. 13, 2005

(54) SLOTTED PLANAR POWER CONDUCTOR

(75) Inventors: Joseph Staudinger, Gilbert, AZ (US); Monte G. Miller, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 1 day.

(21) Appl. No.: 10/738,815

(22) Filed: Dec. 17, 2003

(65) Prior Publication Data

US 2005/0133233 A1    Jun. 23, 2005

(51) Int. Cl.⁷ ................................................ H01B 7/34
(52) U.S. Cl. ..................... 174/36; 174/115; 174/117 F; 333/124
(58) Field of Search ............................. 174/36, 117 F, 174/117 FF; 330/286, 287, 289, 295; 333/1, 333/9, 11, 84 R, 125, 84 M, 127, 128, 136, 333/137, 238

(56) References Cited

U.S. PATENT DOCUMENTS

| | | | | |
|---|---|---|---|---|
| 3,955,156 A | * | 5/1976 | Fleming | 333/128 |
| 4,394,629 A | * | 7/1983 | Kumar et al. | 333/109 |
| 4,947,143 A | * | 8/1990 | Abouzahra et al. | 333/125 |
| 5,291,155 A | * | 3/1994 | Waterman et al. | 333/1 |
| 5,896,065 A | * | 4/1999 | Myer | 330/286 |

FOREIGN PATENT DOCUMENTS

EP         0 751 616 A1 *   7/1997   ......... H03H 9/149

OTHER PUBLICATIONS

Abouzahra et al., "Multiport Power Divider - Combiner Circuits Using Circular-Sector-Shaped Planar Components," *IEEE Transactions on Microwave Theory and Techniques*, vol. 36, No. 12, Dec. 1988, pp. 1747-1751.

Abouzahra et al., "Use of Circular Sector Shaped Planar Circuits for Multiport Power Divider-Combiner Circuits," *IEEE MTT-S Digest*, 1988, pp. 661-664.

Alhargan et al., "Circular and Annular Sector Planar Components of Arbitrary Angle for N-Way Power Dividers/Combiners," *IEEE Transacations on Microwave Theory and Techniques*, vol. 42, No. 9, Sep. 1994, pp. 1617-1623.

Han et al., "Practical Design Consideration of a Modified Structure for Planar Multiport Power Divider at 2 GHz," *Microwave Journal*, vol. 45, No.11, Nov. 2002. pp,102-114, <http://emlab.kyunghee.ac.kr/docs/Practical Design Consideration.pdf>.

Abouzahra et al., "Multiple-Port Power Dividers/Combiners Circuits Using Circular Microstrip Disc Configuration," *IEEE MTT-s Digest*, 1987, pp. 211-214.

(Continued)

*Primary Examiner*—William H. Mayo, III
(74) *Attorney, Agent, or Firm*—Robert L. King; Michael P. Noonan

(57) ABSTRACT

A planar conductor has a first port and a plurality of second ports. A conductive planar region is electrically coupled between the first port and the plurality of second ports. The planar region includes a first region adjacent to the first port, a third region adjacent to the second ports, and a second region between the first region and the third region. Each region has a corresponding greatest width. The greatest width of the second region is less than each of the greatest widths of the first and third regions. Irregular lateral edges of the planar conductor conduct prevent concentrations of an electrical signal at the lateral edges to more uniformly drive devices that are connected to the planar conductor.

24 Claims, 1 Drawing Sheet

OTHER PUBLICATIONS

Leong et al., "Microstrip Notched-Sectorial Power Divider Analysis," *1992 Asia-Pacific Microwave Conference, Adelaide, Australia*, 1992, pp. 669-672.

Kobeissi et al., "Design Technique and Performance Assessment of New Multiport Multihole Power Divider Suitable for M(H)MIC's," *IEEE Transactions on Microwave Theory and Techniques*, vol. 47, No. 4, April 1999, pp. 499-505.

* cited by examiner

SLOTTED PLANAR POWER CONDUCTOR

BACKGROUND

1. Field

The present invention relates to current flow in planar conductors, and, more particularly, to structural characteristics of such planar conductors to regulate characteristics of such current flow.

2. Description of the Related Art

An ideal power divider is a circuit network that divides power applied to an input port between any number of output ports without substantially affecting the phase relationship or otherwise causing the signals at the output ports to be substantially different from one another. There are many different types of power dividers. In practice, power dividers can introduce some level of non-similarities in amplitude and/or phase of the signal at one output port compared to a signal at another output port. This is often true of planar power dividers, where the planar width of the power divider can become large with respect to signal wavelengths. Many different types of planar power dividers have been proposed to solve this problem. While these techniques are helpful, new techniques are still sought to attenuate noncolinearity and phase noncoherence in signals at output ports of planar power dividers.

In the field of high power amplification circuits, for example, input/output matching circuitry may include a combination of distributed transmission line structures formed by relatively uniform and uninterrupted metallization impedance matching patterns (e.g., planar, multi-port power dividers) on high dielectric substrate materials and bond wires connecting the metallization patterns to the input/output terminals of an amplifier device. With increasing power levels, impedance levels generally become lower, the physical width of the active device becomes large which then necessitates a transmission line structure whose width is large and can be a significant portion of a wavelength of the power signal. This large width inherently leads to significant signal amplitude and phase non-uniformity across the connecting device/matching circuit plane. As a consequence, the outer portion of the device is generally driven more strongly than the inner section. This leads to loss of efficiency and degradation in other performance parameters, hot spots in the device periphery, and potentially reduced reliability. In effect, the large active device becomes electrically equivalent to smaller parallel devices driven non-uniformly. Industry is still searching for effective ways to reduce the amplitude and phase non-uniformities introduced by traditional transmission line structures in high power amplifiers and other devices.

BRIEF DESCRIPTION OF THE DRAWINGS

The present invention may be better understood, and its numerous objects, features, and advantages made apparent to those skilled in the art, by referencing the accompanying drawings. The use of the same reference symbols in different drawings indicates similar or identical items.

DETAILED DESCRIPTION OF THE PREFERRED EMBODIMENT(S)

The following discussion is intended to provide a detailed description of at least one example of the invention and should not be taken to be limiting of the invention itself. Rather, any number of variations may fall within the scope of the invention which is properly defined in the claims following this description.

It has been discovered that because current tends to concentrate at planar wire edges, devices are non-uniformly driven so that edge portions of devices burn out faster than interior portions, thereby causing a loss in performance or otherwise damaging the device. Traditional planar power dividers ignore edge characteristics of the power dividers in attempting to address this problem. The novel power dividers disclosed herein include edge features to urge current away from the edges of the power divider to more uniformly drive devices fed by the power divider. In this way, signal phase and amplitude are more uniform over a number of outputs of the power divider.

Figure 1:
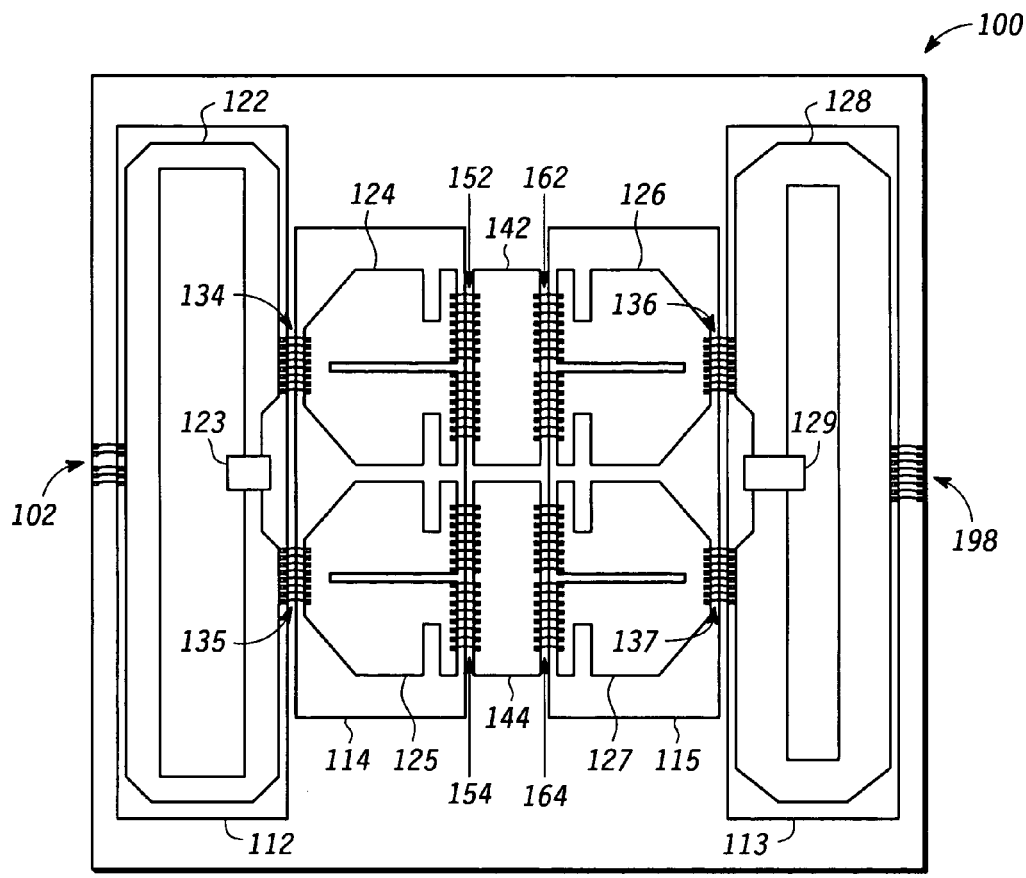
FIG. 1 illustrates a power amplifier in accordance with the invention.

An exemplary single-ended balanced power amplifier topology using this technique is shown in FIG. 1. Power amplifier 100 is coupled to other devices via input bond wires 102 and output bond wires 198. Power amplifier 100 includes a Wilkinson-type input microstrip power divider 122 and output microstrip power combiner 128. Power divider 122 includes resistor 123, and power combiner 128 includes resistor 129. Microstrip power divider 122 is coupled to input impedance matching metallization patterns 124 and 125 via bond wires 134 and 135. Metallization patterns 124 and 125 are planar power dividers receiving a power signal at a number of input bond wires 134, 135, respectively, and providing a divided signal to amplification devices 142, 144 via the more numerous bond wires 152, 154, respectively. Amplification devices 142 and 144 are one or more power transistors, potentially including a number of transistor cells and fingers as is known in the art. Devices 142, 144 are coupled to output metallization patterns 126 and 127 via bond wires 162 and 164, respectively. Output metallization patterns 126 and 127 are coupled to output power combiner 128 via bond wires 136 and 137. Power combiner 128 may be coupled to other devices via output bond wires 198. As shown, divider 122 is disposed on a high k dielectric material 112, metallization patterns 124, 125 are disposed on a high k dielectric material 114, metallization patterns 126, 127 are disposed on a high k dielectric material 115, and divider 128 is disposed on a high k dielectric material 113.

Of particular interest are the networks connected to the input and output terminals of devices 142, 144 (e.g., the gates and drains for field effect transistors or FETs configured for amplification). For example, the relevant input network corresponding to device 142 consists primarily of an inductance formed by the several bond wires 152 and the metallization pattern 124, and the relevant output network corresponding to device 142 consists primarily of an inductance formed by the several bond wires 162 and the metallization pattern 126. The combination of the two forms of those input/output matching circuits determines how effectively the radio-frequency (RF) signal is applied to and extracted from the active device 142.

The width of the metallized pattern 124, for example, must be commensurate with the physical size of device 142 to accommodate bond wire connections at the input terminals. Inherently, the device size (e.g., transistor gate width) of device 142 is proportional to the power capability of amplifier 100 and its physical size becomes significant to support high power levels. For example, a 60-Watt power amplifier 100 using gallium arsenide pseudomorphic high electron mobility transistor (PHEMT) devices biased with a 12-volt supply would likely require a device periphery of approximately 80 mm gate width. With the device implemented using a typical multiple finger approach with gate, drain, and source buses connecting the parallel device terminals, the transistors width can be on the order of 150 mils wide, or more. The width of the metallized patterns formed on the high dielectric constant materials must be commensurate with this dimension to accommodate input/output bond wires. This large width is an electrically significant portion of a wavelength, and if the proper structure is not used, can produce non-uniformity in the signal amplitude and phase across the device's input/output plane.

Figure 2:
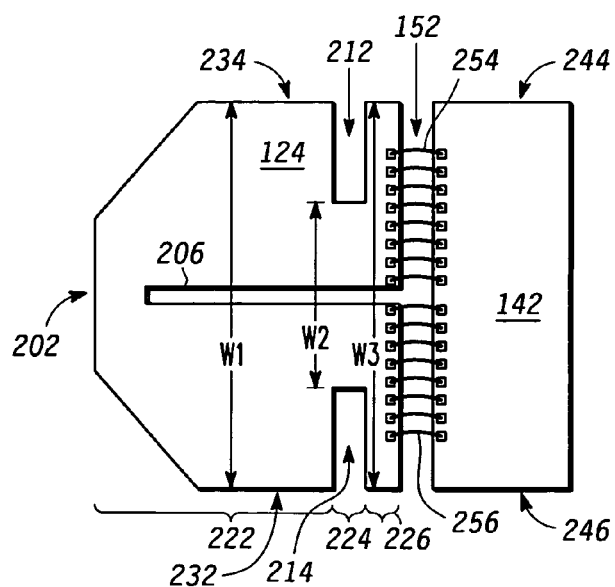
FIG. 2 illustrates a planar power divider in accordance with the invention.

FIG. 2 illustrates a close-up view of metallization 124, bond wires 152 and device 142. Metallization pattern 124 provides a conductive medium for transferring electrical signals from its inputs at edge 202 to its outputs at bond wires 152. Metallization pattern 124 includes a traditional lengthwise slit 206 to aid in splitting current among the bond wires 152.

Metallization pattern 124 also includes edge slots 212 and 214 to cause current perturbations throughout pattern 124 to prevent excessive current at the lateral edges 232, 234. Without slots 212 and 214, the outer device periphery is generally driven more strongly than the central periphery, and signal phase variations exist along this plane as well. That is, bond wires near the edge such as wires 254 and 256 carry more current or charge, thereby driving portions of device 142 nearer to edge 244 or edge 246 more strongly than similar portions located nearer to the center of device 142. This effect would lead to significant limitations, including significant loss of efficiency and other performance parameters, hot spots in the device periphery, and potentially reduced reliability.

Slots 212, 214, on the other hand, urge the electrical signal strength away from the edges of pattern 124, in effect evening out the signal flow among the bond wires 152 by correcting for the otherwise natural urge for the edge portions to carry more signal. By placing slots in a direction perpendicular to the direction of average current flow and by placing those slots at the edges of such current flow, significant variations in signal phase and amplitude between the individual bond wires 152 are prevented.

Thus, the unmetallized rectangular patterns on the high dielectric substrate material alter the electromagnetic field pattern in metallization pattern 124 to result in a more uniform signal distribution. The slots are placed near to and parallel with the substrate/bond wire interface plane. An improvement in both signal amplitude and phase results which allows device 142 to be driven more uniformly across its input/output terminals.

As illustrated, metallization pattern 124 includes three regions: a first region 222, a second region 224, and a third region 226. The regions are defined by the locations of slots 212, 214. As can be seen, the second region 224 forms a narrower neck region between slots 212, 214. The width W2 of second region 224 is less than the width W1 of first region 222 and the width W3 of third region 226. In the illustrated example, the second region, and therefore the slots, are positioned more closely to the outputs 152 than the input edge 202. Placing the slots too far away from the output edge diminishes the edge perturbation effect, and placing the slots too close to the output edge interferes with the ability to bond the wires. The illustrated slots extend past the edge bond wires 254, 256 (e.g., W2 is less than the maximum distance between the edge bond wires). The slots may extend further or less, depending on the application. The precise placement and size may be easily selected through experimentation or simulation by one of ordinary skill in the art taking into account factors such as substrate height, dielectric constant, width of the pattern, frequency of the signal to be transmitted, system impedances, etc.

In one exemplary system without slots 212, 214 including an input matching structure implemented on a high dielectric substrate $W/\epsilon_R=110$, h=8 mil thick, and whose width was commensurate for the previously mentioned 83 mm gate width PHEMT device, and with matched input device impedance, calculation of the forward transmission coefficient from a single input to each bond wire output suggests an amplitude imbalance occurrence of about 0.8 dB with the output periphery of the device being exited more strongly, and a phase imbalance of about 1 degree. However, with the addition of slots 212, 214, signal amplitude uniformity is improved to 0.09 dB from the previous 0.8 dB, while phase uniformity is improved to 0.2 degrees from the previous 1 degree. In this later case, the signal variance is much smaller, and the bond wires may be considered to be equally driven.

Thus, on distributed matching structures connected at gate/drain terminals, the introduction in a connecting plane of slots perpendicular to a desired TEM wave propagation direction, with appropriate geometric properties (slot width, depth, etc.) modifies the electromagnetic fields such that structure results in developing a more uniform signal amplitude and phase across the connecting plane. This can result in improved signal drive into and out of very large FET devices used in high power amplification circuits such as wireless infrastructure transmitters. Each unit cell within the large FET device is driven much more uniformly, yielding improved reliability (outer unit cells would otherwise be over-driven), reduction of thermally induced memory effects, improved amplifier performance, simplified implementation.

The above description is intended to describe at least one embodiment of the invention. The above description is not intended to define the scope of the invention. Rather, the scope of the invention is defined in the claims below. Thus, other embodiments of the invention include other variations, modifications, additions, and/or improvements to the above description.

In one embodiment, a planar conductor includes a first port, a plurality of second ports, and a conductive planar region electrically coupled between the first port and the second ports. The planar region includes a first region adjacent to the first port, a third region adjacent to the second ports, and a second region between the first region and the third region. Each region has a corresponding greatest width. The greatest width of the second region is less than each of the greatest widths of the first and third regions.

In a further embodiment, the planar conductor is coupled as a power divider, the first port is an input port, and the second ports are output ports. In another further embodiment, the planar conductor is coupled as a power combiner, the first port is an output port, and the second ports are input ports. In another further embodiment, the first port is one of a plurality of first ports comprised within the planar power divider/combiner.

In another further embodiment, each of the plurality of second ports is located at an edge of the conductive planar region opposite from the first port, and the second greatest width is less than the longest distance between any two second ports. In another further embodiment, the second region is located substantially closer to the second ports than the first port. In another further embodiment, the widths are measured substantially perpendicular to a direction from the first port to one of the second ports.

In another embodiment, an apparatus includes an amplification device and a metallization pattern. The metallization pattern has a plurality of outputs coupled to the amplification device. The metallization pattern includes an input and a conductive planar region electrically coupled between the input and the outputs. The conductive planar region is shaped so that it has first, second and third widths measured perpendicular to current flow from the input to one of the outputs. The first width is measurable nearer to the input port than the second and third widths. The third width is measurable nearer to the output ports than the first and second widths. The second width is less than the first and third widths.

In another further embodiment, the apparatus further includes a second amplification device and a second metallization pattern. The second metallization pattern includes a plurality of outputs coupled to the second amplification device. The second metallization pattern also includes a conductive planar region electrically coupled between the input and the outputs. The conductive planar region is shaped substantially similarly to the other metallization pattern.

In a further embodiment, the plurality of output ports are located on a side of the region opposite from the input port, and the second width is less than the longest distance between any two output ports. In another further embodiment, the second width is measurable substantially closer to the output ports than the input port.

In another further embodiment, the input port is one of a plurality of input ports comprising the metallization pattern, and the average distance between input ports is smaller than the average distance between output ports.

In another embodiment, a planar power divider/combiner includes a first port, a plurality of second ports, and an electrical energy transport means. The electrical energy transport means is electrically coupled between the first port and the second ports. The electrical energy transport means includes an edge perturbation means at lateral edges of the electrical energy transport means.

In a further embodiment, the edge perturbation means is located proximate to the plurality of second ports to cause perturbations in current flowing between the first port and the second ports to minimize non-uniformities in signals carried by the output ports in comparison with each other. In another further embodiment, the edge perturbation means is located proximate to the plurality of second ports to cause perturbations in current flowing between the first port and the second ports to prevent current concentrations at ones of the second ports nearer to the lateral edges than to a center of the plurality of second ports.

In another further embodiment, the planar power divider/combiner is coupled as a power divider, the first port is an input port, and the second ports are output ports. In another further embodiment, the first port is one of a plurality of first ports comprised within the planar power divider/combiner, and the average distance between first ports is smaller than the average distance between second ports.

In another further embodiment, each of the plurality of second ports is located at an edge of the electrical energy transport means opposite from the first port. The edge perturbation means includes slots perpendicular to current flowing between the first port and the second ports which form a neck in the electrical energy transport means. The neck is narrower than the longest distance between any two second ports. In another further embodiment, the neck is located substantially closer to the second ports than the first port.

In another further embodiment, the widths are measured substantially perpendicular to a direction from the first port to one of the second ports.

In another embodiment, a conductor for transmitting an electrical signal includes an input and an output. The conductor further includes a conductive region coupled between the input and the output. The conductive region has irregular lateral edges to prevent concentration of portions of the electrical signal at said lateral edges to provide a more uniform distribution of said electrical signal across a width of the conductor. In a another further embodiment, the irregular lateral edges are characterized by longitudinal slots in the lateral edges positioned perpendicular to an expected direction of flow of the electrical signal. In another further embodiment, the conductor includes a second output such that the conductor comprises a power divider.

In another embodiment, a method to improve signal phase and amplitude uniformity on parallel signal carriers is provided. The method includes a step in which a planar conductor is provided for transmitting current in a first direction to the signal carriers. The structure has opposing first and second edges substantially parallel to the first direction. The layer has a slot interrupting each edge. Because current can concentrate at planar wire edges, devices are often non-uniformly driven so that edge portions of devices burn out faster than interior portions, thereby causing a loss in performance or otherwise damaging the device. Traditional planar conductors (e.g., power dividers/combiners) ignore edge characteristics in attempting to address this problem. Conductors (and therefore power dividers) are formed to in edge features to urge current away from the edges of the conductors to more uniformly drive devices fed by the conductors. In this way, for example, signal phase and amplitude are more uniform over a number of outputs of power dividers.

The foregoing components and devices are used herein as examples for sake of conceptual clarity. Consequently, as used herein these specific exemplars are intended to be representative of their more general classes. Furthermore, in general, the use of any specific exemplar herein is also intended to be representative of its class and the noninclusion of any specific devices in any exemplary lists herein should not be taken as indicating that limitation is desired. Moreover, alternative embodiments may combine multiple instances of a particular component.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

Because the above detailed description is exemplary, when "one embodiment" is described, it is an exemplary embodiment. Accordingly, the use of the word "one" in this context is not intended to indicate that one and only one embodiment may have a described feature. Rather, many other embodiments may, and often do, have the described feature of the exemplary "one embodiment." Thus, as used above, when the invention is described in the context of one embodiment, that one embodiment is one of many possible embodiments of the invention.

Notwithstanding the above caveat regarding the use of the words "one embodiment" in the detailed description, it will be understood by those within the art that if a specific number of an introduced claim element is intended in the below claims, such an intent will be explicitly recited in the claim, and in the absence of such recitation no such limitation is present or intended. For example, in the claims below, when a claim element is described as having "one" feature, it is intended that the element be limited to one and only one of the feature described. Furthermore, when a claim element is described in the claims below as including or comprising "a" feature, it is not intended that the element be limited to one and only one of the feature described. Rather, for example, the claim including "a" feature reads upon an apparatus or method including one or more of the feature in question. That is, because the apparatus or method in question includes a feature, the claim reads on the apparatus or method regardless of whether the apparatus or method includes another such similar feature. This use of the word "a" as a nonlimiting, introductory article to a feature of a claim is adopted herein by Applicants as being identical to the interpretation adopted by many courts in the past, notwithstanding any anomalous or precedential case law to the contrary that may be found. Similarly, when a claim element is described in the claims below as including or comprising an aforementioned feature (e.g., "the" feature), it is intended that the element not be limited to one and only one of the feature described merely by the incidental use of the definite article.

Furthermore, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Based on the teachings herein, those skilled in the art will readily implement the steps necessary to provide the structures and the methods disclosed herein, and will understand that the process parameters, materials, dimensions, and sequence of steps are given by way of example only and can be varied to achieve the desired structure as well as modifications that are within the scope of the invention. Variations and modifications of the embodiments disclosed herein may be made based on the description set forth herein, without departing from the spirit and scope of the invention as set forth in the following claims.

While particular embodiments of the present invention have been shown and described, it will be obvious to those skilled in the art that, based upon the teachings herein, various modifications, alternative constructions, and equivalents may be used without departing from the invention claimed herein. Consequently, the appended claims encompass within their scope all such changes, modifications, etc. as are within the true spirit and scope of the invention. Furthermore, it is to be understood that the invention is solely defined by the appended claims. The above description is not intended to present an exhaustive list of embodiments of the invention. Unless expressly stated otherwise, each example presented herein is a nonlimiting or nonexclusive example, whether or not the terms nonlimiting, nonexclusive or similar terms are contemporaneously expressed with each example. Although an attempt has been made to outline some exemplary embodiments and exemplary variations thereto, other embodiments and/or variations are within the scope of the invention as defined in the claims below.

What is claimed is:

1. A planar conductor comprising:
   a first port;
   a plurality of second ports; and
   a conductive planar region electrically coupled between the first port and the second ports, the planar region including a first region adjacent to the first port, a third region adjacent to the second ports, and a second region between the first region and the third region, each region having a corresponding greatest width, the greatest width of the second region being less than each of the greatest widths of the first and third regions, the conductive planar region comprising:
      a slit located along a first axis and forming an opening from the third region to the third region; and
      a couple of edge slots in close proximity to the plurality of second ports, each edge slot of the couple of edge slots forming an opening within opposite edges of the conductive planar region and extending within the conductive planar region lateral to at least two of the plurality of plurality of second ports, the couple of edge slots being located along a second axis that is substantially perpendicular to the first axis.

2. The planar conductor of claim 1 wherein the planar conductor is coupled as a power divider, the first port is an input port, and the second ports are output ports.

3. The planar conductor of claim 1 wherein the planar conductor is coupled as a power combiner, the first port is an output port, and the second ports are input ports.

4. The planar conductor of claim 1 wherein each of the plurality of second ports is located at an edge of the conductive planar region opposite from the first port, and the greatest width of the second region is less than a distance between two second ports that are furthest separated of all of the plurality of second ports.

5. The planar conductor of claim 1 wherein the second region is located substantially closer to the second ports than the first port.

6. The planar conductor of claim 1 wherein the widths are measured substantially perpendicular to a direction from the first port to one of the second ports.

7. The planar conductor of claim 1 wherein the first port is one of a plurality of first ports within the planar conductor.

8. An apparatus comprising:
   an amplification device;
   a metallization pattern having a plurality of outputs coupled to the amplification device, the metallization pattern including an input and a conductive planar region electrically coupled between the input and the outputs, wherein the conductive planar region is shaped so that it has first, second and third widths measured perpendicular to current flow from the input to one of the outputs, the first width being measurable nearer to the input port than the second and third widths, and the third width being measurable nearer to the output ports than the first and second widths, the second width being less than the first and third widths, the metallization pattern comprising:
      a slit located along a first axis and forming an opening within the conductive planar region that is substantially central to the plurality of outputs and extending from the plurality of outputs toward the input; and a couple of edge slots in close proximity to the plurality of outputs, each edge slot of the couple of edge slots forming an opening within opposite edges of the conductive planar region and extending within the conductive planar region lateral to at least two of the plurality of plurality of second ports, the couple of edge slots being located along a second axis that is substantially perpendicular to the first axis.

9. The apparatus of claim 8 wherein the plurality of output ports are located on a side of the region opposite from the input port, and the second width is less than the longest distance between any two output ports.

10. The apparatus of claim 8 wherein the second width is measurable substantially closer to the output ports than the input port.

11. The apparatus of claim 8 wherein the input port is one of a plurality of input ports comprising the metallization pattern, the average distance between input ports being smaller than the average distance between output ports.

12. The apparatus of claim 8 further comprising:
a second amplification device;
a second metallization pattern having a plurality of outputs coupled to the second amplification device, the second metallization pattern including a conductive planar region electrically coupled between the input and the outputs shaped substantially similarly to the other metallization pattern.

13. A planar power divider/combiner comprising:
a first port;
a plurality of second ports; and
an electrical energy transport means electrically coupled between the first port and the second ports, the electrical energy transport means including an edge perturbation means at lateral edges of the electrical energy transport means, the electrical energy transport means comprising:
a slit located along a first axis and forming an opening from the plurality of second ports to the first port; and
a couple of edge slots in close proximity to the plurality of second ports which form the edge perturbation means, each edge slot of the couple of edge slots forming an opening within the lateral edges of the electrical energy transport means and extending into the electrical energy transport means to pass laterally along at least two of the plurality of plurality of second ports, the couple of edge slots being located along a second axis that is substantially perpendicular to the first axis.

14. The planar power divider/combiner of claim 13 wherein the edge perturbation means is located proximate to the plurality of second ports to cause perturbations in current flowing between the first port and the second parts to minimize non-uniformities in signals carried by the plurality of second ports in comparison with each other.

15. The planar power divider/combiner of claim 13 wherein the edge perturbation means is located proximate to the plurality of second ports to cause perturbations in current flowing between the first port and the second ports to prevent current concentrations at ones of the second ports nearer to the lateral edges than to a center of the plurality of second ports.

16. The planar power divider/combiner of claim 13 wherein the planar power divider/combiner is coupled &s a power divider, the first port is an input port, and the second ports are output ports.

17. The planar power divider/combiner of claim 13 wherein each of the plurality of second ports is located at an edge of the electrical energy transport means opposite from the first port, and each of the plurality of second ports comprises a bond wire for electrical connection to the planar power divider/combiner.

18. The planar power divider of claim 17 further comprising:
a device connected to each bond wire connected to the plurality of second ports.

19. The planar power divider of claim 18 wherein the device comprises an amplification device.

20. The planar power divider of claim 13 wherein the first port is one of a plurality of first ports comprised within the planar power divider/combiner, the average distance between first ports being smaller than the average distance between second ports.

21. A conductor for transmitting an electrical signal, the conductor having an input and an output and a conductive region coupled between the input and the output, the conductive region comprising:
a first plurality of electrical connections at the input;
a second plurality of electrical connections at the output;
a slit located along a first axis of the conductor and forming a centrally positioned opening extending from one of the input or the output across the conductor and through more than one-half of the conductor; and
a couple of edge slots in close proximity to the one of the input or the output in which the slit extends from, each edge slot of the couple of edge slots forming an opening within opposite edges of the conductor and extending within the conductive planar region lateral to at least two of the first plurality or second plurality of electrical connections, the couple of edge slots being located along a second axis that is substantially perpendicular to the first axis.

22. The conductor of claim 21 further comprising an amplification device coupled to the second plurality of electrical connections.

23. The conductor of claim 22 wherein the amplification device is coupled to the second plurality of electrical connections by a plurality of bond wires.

24. A method to improve signal phase and amplitude uniformity on parallel signal carriers, the method comprising:
providing a conductor for transmitting current, the conductor having an input and an output;
providing a first plurality of electrical connections at the input;
providing a second plurality of electrical connections at the output;
locating a slit along a first axis of the conductor and forming a centrally positioned opening extending from one of the input or the output across the conductor and through more than one-half of the conductor; and
locating a couple of edge slots in close proximity to the one of the input or the output in which the slit extends from, each edge slot of the couple of edge slots forming an opening within opposite edges of the conductor and extending within the conductive planar region lateral to at least two of the first plurality or the second plurality of electrical connections, the couple of edge slots being located along a second axis that is substantially perpendicular to the first axis.

* * * * *

UNITED STATES PATENT AND TRADEMARK OFFICE
CERTIFICATE OF CORRECTION

PATENT NO. : 6,943,289 B2  Page 1 of 1
APPLICATION NO. : 10/738815
DATED : September 13, 2005
INVENTOR(S) : Joseph Staudinger It is certified that error appears in the above-identified patent and that said Letters Patent is hereby corrected as shown below:

In Column 9, Line 64, Claim No. 16:

Change "is coupled &s a" to --is coupled as a--

Signed and Sealed this

Twentieth Day of May, 2008

JON W. DUDAS
*Director of the United States Patent and Trademark Office*